United States Patent [19]

Tobita

[11] Patent Number: 5,051,995
[45] Date of Patent: Sep. 24, 1991

[54] SEMICONDUCTOR MEMORY DEVICE HAVING A TEST MODE SETTING CIRCUIT

[75] Inventor: Yoichi Tobita, Hyogo, Japan

[73] Assignee: Mitsubishi Denki Kabushiki Kaisha, Tokyo, Japan

[21] Appl. No.: 302,034

[22] Filed: Jan. 26, 1989

[30] Foreign Application Priority Data

Mar. 14, 1988 [JP] Japan .................. 63-61436

[51] Int. Cl.$^5$ ........................... G11C 29/00
[52] U.S. Cl. .................. 371/21.1; 371/21.4; 365/201
[58] Field of Search ............ 371/21.1, 21.4; 365/201

[56] References Cited

U.S. PATENT DOCUMENTS

| 4,055,754 | 10/1977 | Chesley | 365/201 |
| 4,464,750 | 8/1984 | Tatematsu | 365/201 |
| 4,541,090 | 9/1985 | Shiragasawa | 365/201 |
| 4,654,827 | 3/1987 | Childers | 365/201 |
| 4,672,582 | 6/1987 | Nishimura et al. | 365/201 |
| 4,727,517 | 2/1988 | Ueno et al. | 365/104 |
| 4,771,407 | 9/1988 | Takemae et al. | 371/21.1 |
| 4,802,137 | 1/1989 | Okuda et al. | 365/201 |
| 4,860,259 | 8/1989 | Tobita | 365/201 |
| 4,879,690 | 11/1989 | Anami et al. | 371/21.1 |

FOREIGN PATENT DOCUMENTS

3639169A1  11/1986  Fed. Rep. of Germany .
60-50065  11/1985  Japan .
61-26154  6/1986  Japan .

Primary Examiner—Jerry Smith
Assistant Examiner—Phung My Chung
Attorney, Agent, or Firm—Lowe, Price, Leblanc and Becker

[57] ABSTRACT

In a semiconductor memory device having a test mode setting circuit, when a voltage higher than a common operation range is applied to an input terminal (101) receiving $\overline{CAS}$ signals, a first voltage detecting circuit (100) detects the voltage and the detected output is latched in a latch circuit (110). A voltage setting circuit (1 20) sets a cell plate voltage of a memory cell (1a) approximately at the ground potential in response to the latch output. Consequently, the operation margin of the memory cell for the data "1" can be carried out by the V bump test. Meanwhile, when a voltage higher than the normal operation range is applied to an input terminal (201) receiving $\overline{WE}$ signals, a second voltage detecting circuit (200) detects the voltage and the detected output is latched in the latch circuit (201). The voltage setting circuit sets the cell plate voltage approximately at Vcc in response to the latch output from the latch circuit.

8 Claims, 7 Drawing Sheets

FIG.6 PRIOR ART

| CELL PLATE VOLTAGE \ CELL DATA | "0" | "1" |
|---|---|---|
| $V_{cc}$ | $-\frac{1}{2} \cdot \frac{C_6}{C_{13}+C_6}(V_{cc}-\Delta V)$ | $\frac{1}{2} \cdot \frac{C_6}{C_{13}+C_6}(V_{cc}+\Delta V)$ |
| FIXED | $-\frac{1}{2} \cdot \frac{C_6}{C_{13}+C_5}(V_{cc}+\Delta V)$ | $\frac{1}{2} \cdot \frac{C_6}{C_{13}+C_6}(V_{cc}+\Delta V)$ |
| $\frac{1}{2}V_{cc}$ | $-\frac{1}{2} \cdot \frac{C_6}{C_{13}+C_6}V_{cc}$ | $\frac{1}{2} \cdot \frac{C_6}{C_{13}+C_6}V_{cc}$ |

FIG.7

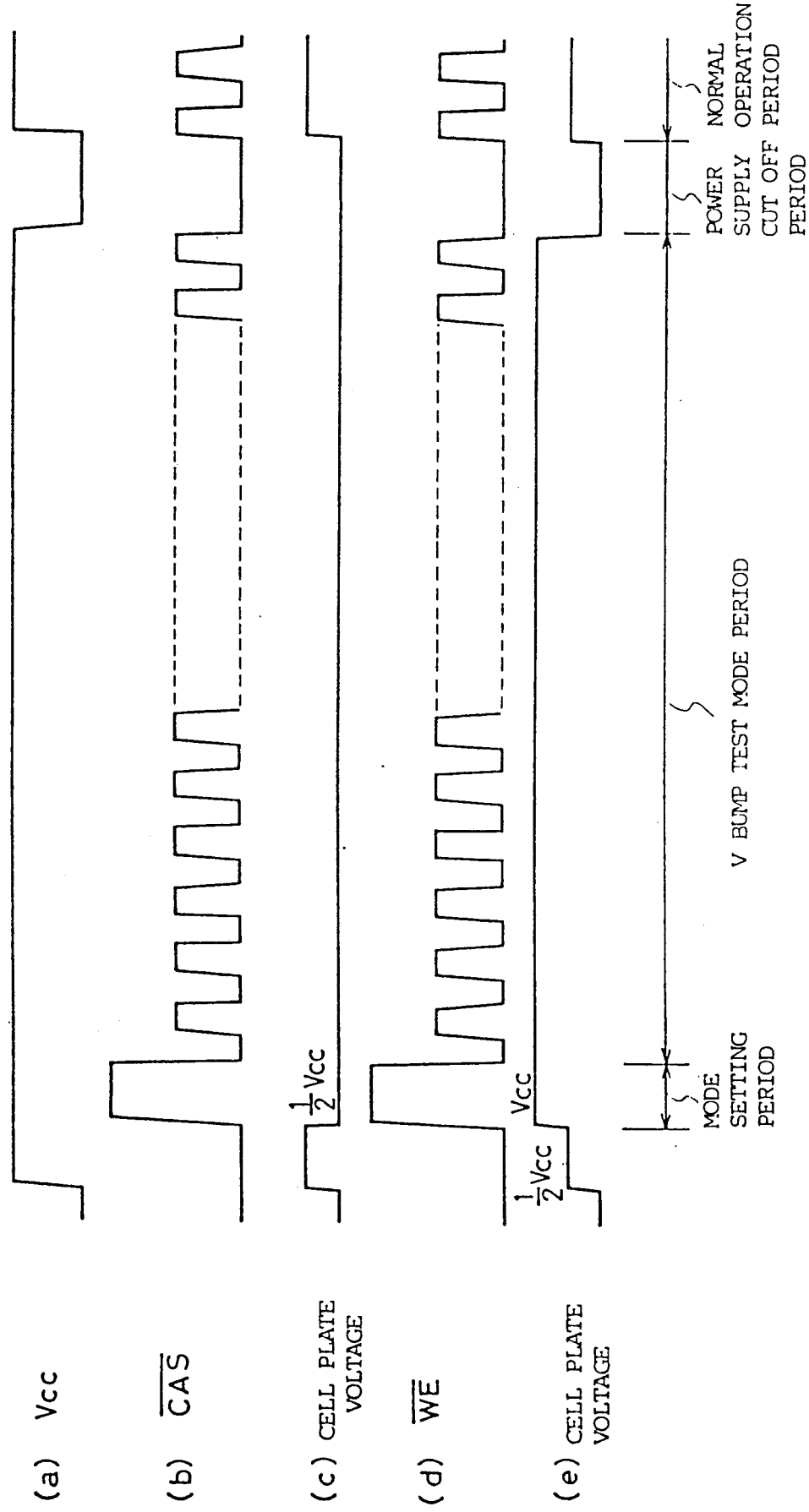

SEMICONDUCTOR MEMORY DEVICE HAVING A TEST MODE SETTING CIRCUIT

BACKGROUND OF THE INVENTION

1. Field of the Invention

The present invention relates to a semiconductor memory device having a test mode setting circuit. More specifically, the present invention relates to a semiconductor memory device having a test mode setting circuit for setting a dynamic RAM (hereinafter referred to as DRAM), comprising a plurality of memory cells each consisting of an insulated gate type field effect transistor (hereinafter referred to as MOS transistor) and a capacitance, at a mode for supply voltage fluctuation test (hereinafter referred to as V bump test).

2. Description of the Prior Art

Due to the development of the technology of manufacturing semiconductor integrated circuits and to a strong desire to reduce cost, the degree of integration of a DRAM has increased quadruple in about three years. DRAMs of 4M bit capacitance have come into use. When data "0" are written in all of the memory cells, the data "0" are read from all memory cells, data "1" are written in all memory cells and the data "1" are read from all memory cells in this DRAM in the cycle time of 10 μsec (maximum pulse width of a $\overline{RAS}$ (row address strobe) signal), the time T1 for testing is represented by the following equation (1).

$$T1 = 4 \text{ (writing ``0''} \rightarrow \text{reading ``0''} \rightarrow \text{writing ``1''} \rightarrow \text{reading ``1'')} \times 4 \times 10^6 \text{ (memory capacitance)} \times 10 \text{ μsec (cycle time)} = 160 \text{ sec} \quad (1)$$

In a common dynamic RAM, the aforementioned test should be carried out under four different conditions, namely, at the maximum value 5.5 V and minimum value 4.5 V of the operational range of supply voltage, and at higher temperature 70° C. and lower temperature 0° C. of the operational temperature range.

In this case, the time T2 for testing will be $$T2 = 160 \text{ sec} \times 4 = 640 \text{ sec} \quad (2)$$

the above value is very long as a time for testing an integrated circuit, and this lowers the production yield and increases cost.

In addition, sometimes the above described test is not sufficient for detecting defects. Other tests should be carried out with different combinations of timings of input signals, order of designating addresses, patterns of data to be written in the memory cells, and so on. Such tests require a long period of time.

A supply voltage fluctuation test (hereinafter referred to as V bump test) has been employed, which is capable of testing operation margins of these memory cells in a short period of time, in consideration of the fact that almost all memory cells malfunction in the combination test have small operation margins. However, as the memory capacitance becomes larger and larger, the effect of V bump test becomes smaller. The reason for this will be described in the following with reference to FIGS. 1 to 5.

FIG. 1 is a block diagram showing a schematic structure of a conventional DRAM to which the present invention is applied.

Referring to FIG. 1, the DRAM comprises a memory cell array MA, and address buffer AB, an X decoder ADX, an Y decoder ADY, a sense amplifier and I/O SI, and an output buffer OB. The memory cell array MA comprises a plurality of memory cells arranged in rows and columns for storing information. The address buffer AB receives external address signals to generate internal address signals. The X decoder ADX decodes an internal address signal applied from the address buffer AB to select a corresponding row in the memory cell array. The Y decoder decodes an internal column address signal applied from the address buffer AB to select a corresponding column in the memory cell array MA.

The sense amplifier and I/O SI detects and amplifies information stored in the selected memory cell in the memory cell array MA and outputs the information as read data to the output buffer OB in response to a signal from the Y decoder ADY. The output buffer OB receives the read data to output data OUT to the outside. A control signal generating system CG is provided as a peripheral circuit for generating signals for controlling timings of various operations in the DRAM.

FIG. 2 shows a schematic structure of the memory cell array portion of FIG. 1.

Referring to FIG. 2, the memory cell array MA comprises a plurality of word lines WL1, WL2, ..., WLn and a plurality of bit lines BL0, $\overline{BL0}$, BL1, $\overline{BL1}$, ..., BLM, $\overline{BLm}$. Each of the word lines WL1, ..., WLn is connected to one row of the memory cells. The bit lines form folded bit lines, in which two bit lines constitute a bit line pair. Namely, the bit lines BL0 and $\overline{BL0}$ constitute a bit line pair, bit lines BL1 and $\overline{BL1}$ constitute a bit line pair and the bit lines BLm and $\overline{BLm}$ constitute a bit line pair, in the same manner.

Memory cells 1 are connected to intersections of the bit lines BL0, $\overline{BL0}$, ... BLn, $\overline{BLn}$ and every other word lines. Namely, a memory cell is connected to an intersection of one word line and either one of the pair of bit lines. A precharging/equalizing circuit 150 for equalizing the potential of each bit line pair and precharging the same to a prescribed potential $V_B$ is provided at each bit line pair. A sense amplifier 50 is provided for each bit line pair, which is activated in response to signals $\phi A$ and $\phi B$ transmitted on signal lines 30 and 40 for detecting and differentially amplifying the potential difference between the bit line pair. Each of the bit lines is selectively connected to data input/output busses I/O, $\overline{I/O}$ in response to an address decode signal from the Y decoder ADY. Namely, the bit lines BL0 and $\overline{BL0}$ are respectively connected to the data input/output busses I/O and $\overline{I/O}$ transfer gates T0 and T0'.

In a similar manner, the bit lines BL1, $\overline{BL1}$ are connected to the data input/output busses I/O and $\overline{I/O}$ through transfer gates T1 and T1', and bit lines BLm and $\overline{BLm}$ are respectively connected to the data input/output busses I/O and $\overline{I/O}$ transfer gates Tm and Tm'. The address decoder signal from the Y decoder ADY is transmitted to the gates of the respective transfer gates T0, T0', ..., Tm, Tm'. Thus a pair of bit lines is connected to the data input/output busses I/O and $\overline{I/O}$.

FIG. 3 shows a detailed structure of one of the bit line pairs shown in FIG. 2. In FIG. 3, only one word line and one bit line pair are shown for the simplicity.

Referring to FIG. 3, a precharging/equalizing circuit 150 is provided for precharging a pair of bit lines 2 and 7 to a prescribed potential $V_B$ at the standby state of the memory and for equalizing the potential of the bit lines 2 and 7 at a prescribed potential. The precharging/e- qualizing circuit 150 comprises n channel MOS transistors 10 and 11 responsive to a precharging signal $\phi_P$ for electrically connecting these bit lines 2 and 7 by transmitting a prescribed precharge potential to the bit lines 2 and 7, and for equalizing the potential of the bit lines 2 and 7. Both of the n channel MOS transistors 10 and 11 become conductive in response to the precharging signal $\phi_P$ applied through the signal line 12 and apply the precharge potential $V_B$ on the signal line 9 to the bit lines 2 and 7.

The memory cell 1 is constituted by a transfer gate 5 formed of an n channel insulated gate field effect transistor and a capacitance 6. The transfer gate 5 has its gate connected to the word line 3 and its source connected to the bit line 2. The capacitance 6 is connected to the drain of the transfer gate 5 through a node 4, and the data of the memory cell 1 is stored in the node 4. The node 4 forms a so-called storage node.

When the word line 3 is selected, a word line driving signal Rn is sent to the transfer gate 5 to render the transfer gate 5 conductive, whereby the information stored in the memory cell 1 is transferred onto the bit line 2. A memory cell is connected to the bit line 2, while no memory cell is connected to the intersection between the word line 3 and the bit line 7. Therefore, when the memory cell 1 shown in FIG. 3 is selected, the bit line 7 applies the reference potential in association with the bit line 2 to the sense amplifier 50. The bit lines 2 and 7 respectively comprise parasitic capacitances 13 and 14.

Resistances 17 and 18 forming a constant voltage generating circuit are connected in series between the power supply 16 and the ground. A constant voltage defined by resistance division is generated at the node of the resistances 17 and 18. The resistance value of the resistances 17 and 18 are selected such that the level of the voltage is ½ of the common supply voltage. The output voltage of the constant voltage generating circuit is applied to the other electrode of the capacitance 6 through a signal line 8. The capacitance 6 is formed of a balanced plate electrode with the dielectric being a thin insulating film such as a single layer silicon oxide or a laminated film of silicon oxide and silicon nitride. The magnitude thereof is dependent on the area of the memory cell.

The area of the memory cell has been smaller and the memory cell capacitance has also been smaller as the degree of integration (memory capacitance) has been increased. In order to prevent malfunctions (soft errors) of a DRAM derived from α rays emitted from the outer package of the DRAM, the memory cell capacitance value of about 50 PF is required in general. Therefore, the reduction of the memory cell capacitance derived from the reduction of memory cell area has been compensated for by thinning the film thickness of the dielectric. However, when the film thickness of the dielectric is made thin, the electric field applied on the insulating film becomes strong, causing possible destruction of the insulating film and lowering the reliability of the DRAM. This disadvantage has become significant from 1M bit DRAMs which are actually used at present. In order to cope with the problem, a voltage half as large as the supply voltage provided by the division of the resistances 17 and 18 is supplied to the electrode (hereinafter referred to as a cell plate electrode) on the power supply side of the memory cell capacitance, as shown in FIG. 3. This method is disclosed in Japanese Patent Publication Gazette No. 50065/1985 (U.S. Ser. No. 722,841). According to this method, the electric field is determined by the voltage difference between the storage node 4 and the cell plate electrode, and the electric field becomes ½, since the voltage on the cell plate becomes the intermediate value between the data "1" and "0".

However, the application of the voltage half as large as the supply voltage to the cell plate electrode makes it difficult to detect memory cells having small operation margins by V bump test. The reasons will be described in the following.

In the DRAMs of the capacitances less than 1M bit, the insulating film constituting the dielectric of the memory cell capacitance is relatively thick (about 150 Å~200 Å in a DRAM of 256 k bit), and therefore, the voltage of the cell plate electrode need not be set at ½ Vcc. Therefore, a voltage of Vcc or 0 level is supplied from the power supply line or from the ground line which has small impedance and therefore little noise. The constant voltage generating circuit shown in FIG. 3 has relatively high impedance and noise is liable to occur during the operation of the DRAM to reduce operation margin thereof, so that it had not been used.

The effect of V bump test of cases in which the level of the cell plate electrode is power supply voltage Vcc, ground (fixed level) and Vcc/2 will be compared in the following.

(1) When the Level of the Cell Plate Electrode Is the Power Supply Voltage Vcc

The voltage waveforms with respective nodes related to the V bump test are shown in FIGS. 4 and 5. The V bump test is carried out by writing data in the memory cell 1 with a certain supply voltage Vcc, raising the supply voltage Vcc by a certain level as shown in FIG. 4(a) and thereafter by reading data from the memory cell 1. In FIG. 4, the data is written with the supply voltage Vcc and the data is read with the voltage $V_{cc} + \Delta V$. The precharge voltage $V_B$ is as shown in FIG. 4(b), since it is set at a value equal to ½ of the supply voltage Vcc. It is assumed that the data "0" is written in the storage node 4, so that the storage node 4 is at 0 V in writing. However, it is supposed that the potential on the storage node 4 rises by the amount of fluctuation due to the coupling of the fluctuation of the supply voltage through the capacitance 6, as shown in FIG. 4(c). On this occasion, the potential of the bit lines 2 and 7 changes with the precharge potential $V_B$ to be approximately the same level as the precharge potential $V_B$.

The data reading operation from the memory cell 1 will be described in the following with reference to FIG. 5. As shown in FIG. 5(a), when the precharge signal $\phi_P$ becomes low level at the time $t_0$, the signal line 9 and the bit lines 2 and 7 are separated from each other. When the word line driving signal Rn rises at the time $t_1$ as shown in FIG. 5(b), the MOS transistor 5 becomes conductive, a current flows from the bit line having higher potential to the storage node 4, whereby the potential on the bit line 2 drops as shown in FIG. 5(c) and the potential on the storage node 4 rises as shown in FIG. 5(d). At the time $t_2$, the change of the potential settles and the reading levels of the bit lines 2 and 7 are established. The levels on the bit lines 2 and 7 on this occasion can be represented by the following equation.

In consideration of the law of conservation of electric charge applied between the bit line 2 and the storage node 4 before and after the conduction of the MOS transistor 5, $$\tfrac{1}{2}(Vcc+\Delta V)\cdot C_{13}+\Delta V\cdot C_6=(C_{13}+C_6)\cdot V_{B0} \tag{3}$$

$$V_{B0}=1/(C_{13}+C_6)\cdot[\tfrac{1}{2}(Vcc+\Delta V)\cdot C_{13}+\Delta V\cdot C_6] \tag{4}$$

the voltage difference $V_{S0}$ with the bit line 7 will be $$\begin{aligned}V_{S0} &= 1/(C_{13}+C_6)\cdot[\tfrac{1}{2}\cdot Vcc+\Delta V)\cdot C_{13}+\Delta V\cdot C_6] - \\ &\quad \tfrac{1}{2}\cdot(Vcc+\Delta V) \end{aligned} \tag{5}$$

$$= -\tfrac{1}{2}\cdot C_6/(C_{13}+C_6)\cdot(Vcc+\Delta V) \tag{6}$$

the voltage difference becomes smaller by the amount of $\Delta V$, providing V bump effect.

(2) When the Level Is Fixed (the Cell Plate Voltage Is Fixed in Association with the Vcc Fluctuation)

When data "0" is written in the memory cell 1, $$\tfrac{1}{2}(Vcc+\Delta V)\cdot C_{13}=(C_{13}+C_6)\cdot V_{B0} \tag{7}$$

$$V_{B0}=1/(C_{13}+C_6)[\tfrac{1}{2}(Vcc+\Delta V)\cdot C_{13}] \tag{8}$$

$$V_{S0}=1/(C_{13}+C_6)[\tfrac{1}{2}(Vcc+\Delta V)\cdot C_{13}-\tfrac{1}{2}(Vcc+\Delta V) \tag{9}$$

$$V_{S0}=-\tfrac{1}{2}\cdot C_6/(C_{13}+C_6)\cdot(Vcc+\Delta V) \tag{10}$$

For the data "0", the V bump produces a reverse effect, enlarging the voltage difference. When the data "1" is written in the memory cell 1, $$\tfrac{1}{2}(Vcc+\Delta V)\cdot C_{13}+(Vcc+\Delta V)C_6=(C_{13}+C_6)V_{B1} \tag{11}$$

$$V_{B1}=1/(C_{13}+C_6)\cdot[\tfrac{1}{2}(Vcc+\Delta V)\cdot C_{13}+(Vcc+\Delta V)\cdot C_6] \tag{12}$$

$$V_{S1}=\tfrac{1}{2}\cdot C_6/(C_{13}+C_6)\cdot(Vcc-\Delta V) \tag{13}$$

For the data "1", the voltage difference becomes smaller, and therefore, there is the V bump effect.

(3) When the Level Is ½ Vcc

In this case, the voltage level of the cell plate electrode changes only by ½·$\Delta V$, so that the change of the level on the storage node 4 will be also ½·$\Delta V$. In the similar manner as the above description, $$\tfrac{1}{2}(Vcc+\Delta V)\cdot C_{13}+\tfrac{1}{2}\cdot\Delta V\cdot C_6=(C_{13}+C_6)\cdot V_{B0} \tag{14}$$

$$V_{B0}=1/(C_{13}+C_6)[\tfrac{1}{2}(Vcc+\Delta V)\cdot C_{13}+\tfrac{1}{2}\cdot\Delta V\cdot C_6] \tag{15}$$

$$\begin{aligned}V_{S0} &= 1/(C_{13}+C_6)\cdot[\tfrac{1}{2}\cdot Vcc+\Delta V)\cdot C_{13} + \\ &\quad \tfrac{1}{2}\cdot\Delta V\cdot C_6] - \tfrac{1}{2}\cdot(Vcc+\Delta V) \end{aligned} \tag{16}$$

$$= -\tfrac{1}{2}\cdot C_6/(C_{13}+C_6)\cdot(Vcc+\Delta V) \tag{17}$$

there is no term V and therefore there is no V bump effect.

When data "1" is written in the memory cell, $$\tfrac{1}{2}(Vcc+\Delta V)\cdot C_{13}+(Vcc+\tfrac{1}{2}\cdot\Delta V)\cdot C_6=(C_{13}+C_6)\cdot V_{B1} \tag{18}$$

$$V_{B1}=1/(C_{13}+C_6)[\tfrac{1}{2}(Vcc+\Delta V)\cdot C_{13}+(Vcc+\tfrac{1}{2}\cdot\Delta V)\cdot C_6] \tag{19}$$

$$\begin{aligned}V_{S1} &= 1/(C_{13}+C_6)[\tfrac{1}{2}\cdot(Vcc+\Delta V)\cdot C_{13}+(Vcc+\tfrac{1}{2}\cdot \\ &\quad \Delta V)\cdot C_6 \end{aligned} \tag{20}$$

$$= \tfrac{1}{2}\cdot C_6/(C_{13}+C_6)\cdot Vcc \tag{21}$$

there is no term $\Delta V$ and therefore no V bump effect.

FIG. 6 shows the above relations.

There is a clear difference between cases in which the cell plate voltage is Vcc or is fixed and the case in which the voltage is ½·Vcc. Namely, when the cell plate voltage is Vcc or it is fixed, the voltage difference between a pair of bit lines, that is, input voltage difference of the sense amplifier changes by $\Delta V$. Therefore, the reading margin of the memory cell can be tested by $\Delta V$. However, when it is ½·Vcc, the input voltage difference of the sense amplifier cannot be changed by $\Delta V$. Therefore, the reading margin of the memory cell cannot be tested by using $\Delta V$.

SUMMARY OF THE INVENTION

Therefore, an object of the present invention is to provide a semiconductor memory device having a test mode setting circuit capable of reducing destruction of insulating film of the memory cell capacitance and capable of setting a mode for testing memory cells having small operation margins in a short period of time.

Another object of the present invention is to provide a semiconductor memory device having a test mode setting circuit which is capable of setting the cell plate voltage at ½·Vcc in normal operation of a DRAM and setting the cell plate voltage at a fixed level of the supply voltage Vcc only in the V bump test.

The present invention is a semiconductor memory device having a test mode setting circuit for effecting a V bump test on a semiconductor memory device comprising a plurality of memory cells each consisted of an insulated gate type field effect transistor and a capacitance, and at least one external input terminal. The test mode setting circuit is structured such that a constant voltage generating circuit is connected to one electrode of the capacitance and the voltage generated from the constant voltage generating means is controlled when signal voltages applied to at least one external input terminal are out of a predetermined operation range.

According to the present invention, by setting the level of input signals out of the operation range which is generally used, the memory cell gate voltage is controlled to enable testing of memory cells having small margin in a short period of time.

In a preferred embodiment of the present invention, first and second voltage detecting circuits are provided for detecting that the signal voltages respectively applied to at least one external terminal have exceeded a predetermined voltage. In response to the detection output from the first voltage detecting circuit, a voltage of the ground potential is outputted from the constant voltage generating means, and in response to the detection output of the second voltage detecting circuit, a voltage approximately at the power supply potential is outputted.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows various levels of cell plate electrode;

FIG. 7 is a schematic block diagram of one embodiment of the present invention;

FIG. 9 is a timing diagram illustrating the operation of FIG. 8.

DESCRIPTION OF PREFERRED EMBODIMENTS

Figure 1:
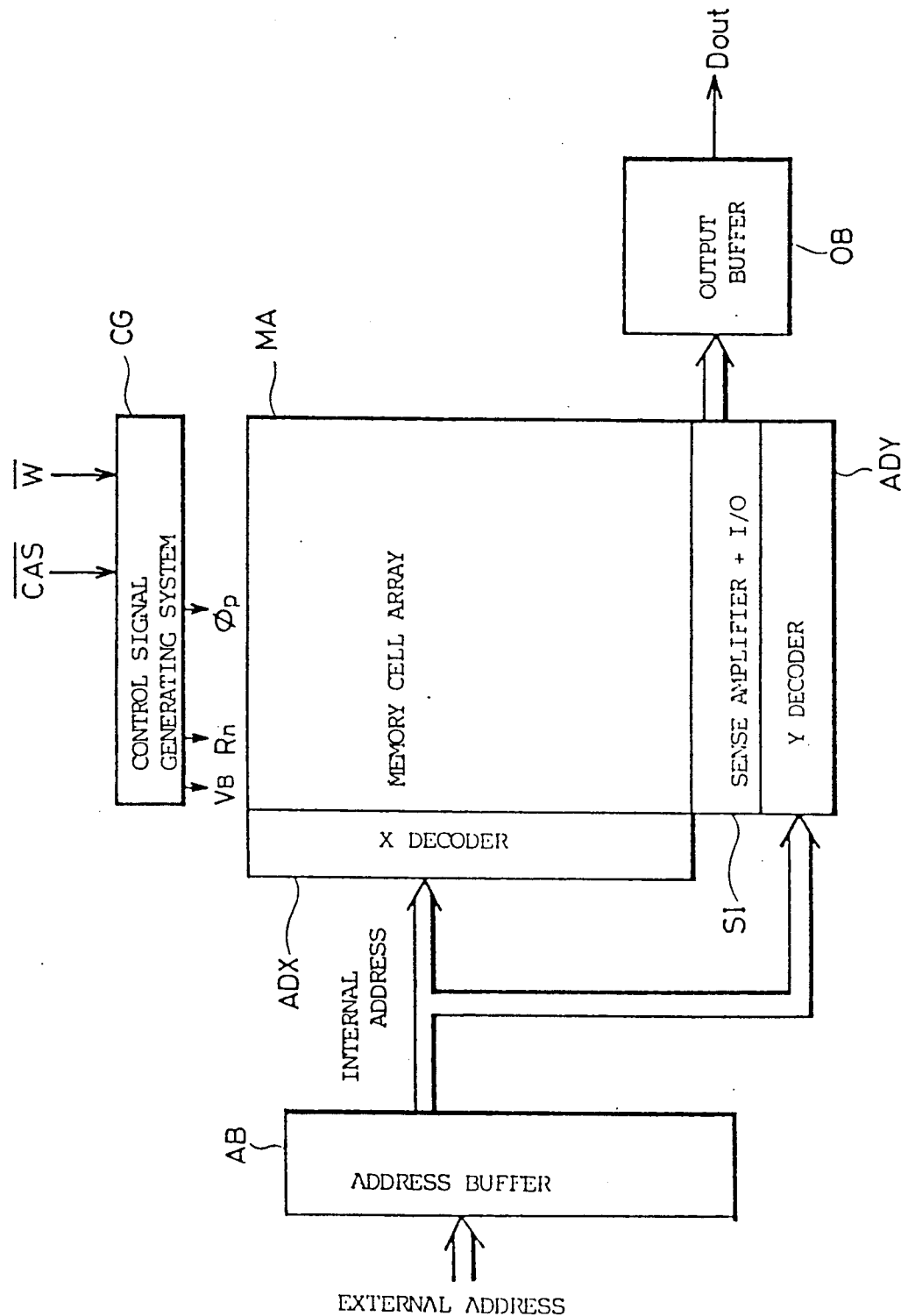
FIG. 1 is a schematic block diagram showing the whole structure of a reading portion of a conventional DRAM.
Figure 2:
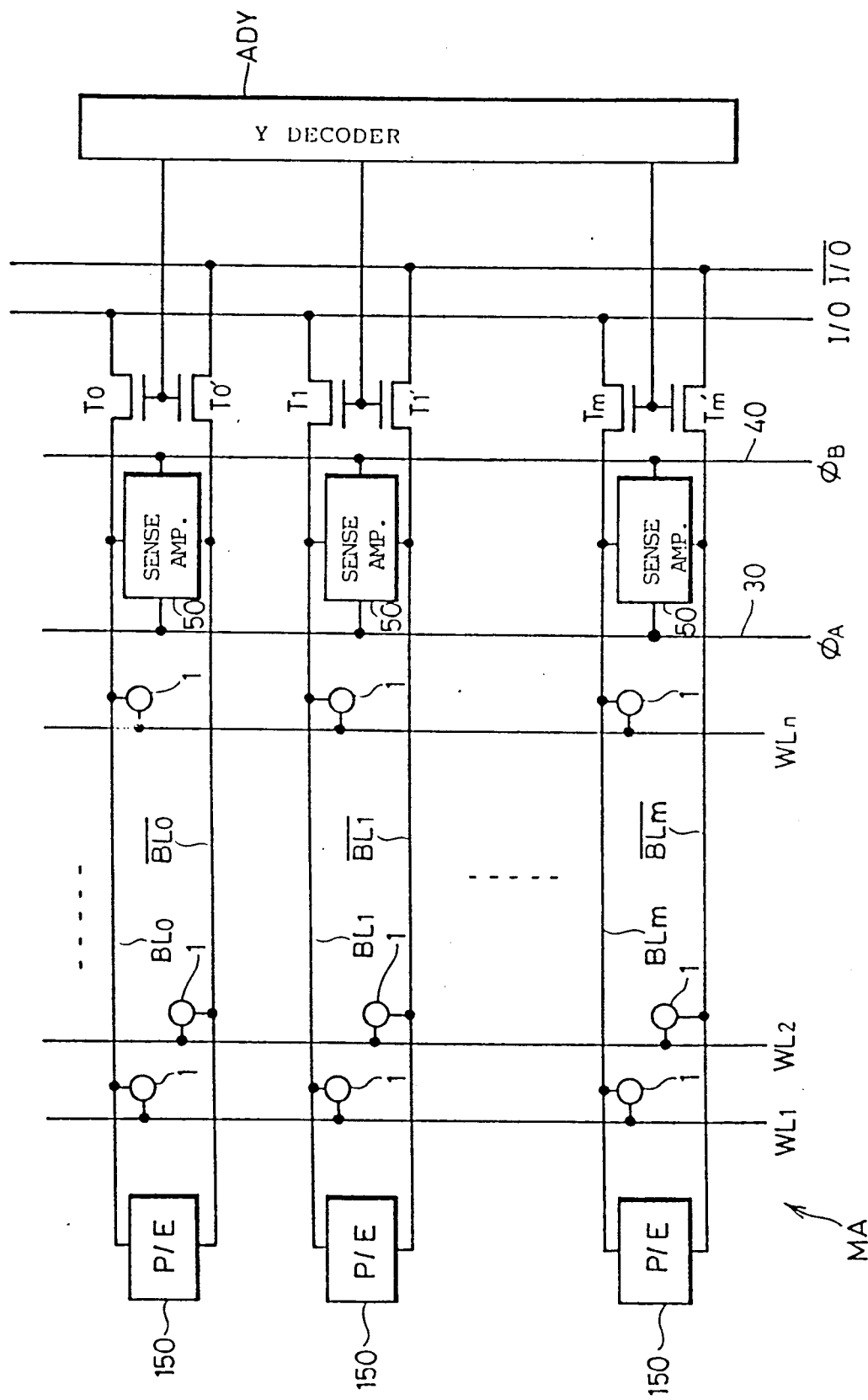
FIG. 2 shows a schematic structure of the memory cell array shown in FIG. 1.
Figure 3:
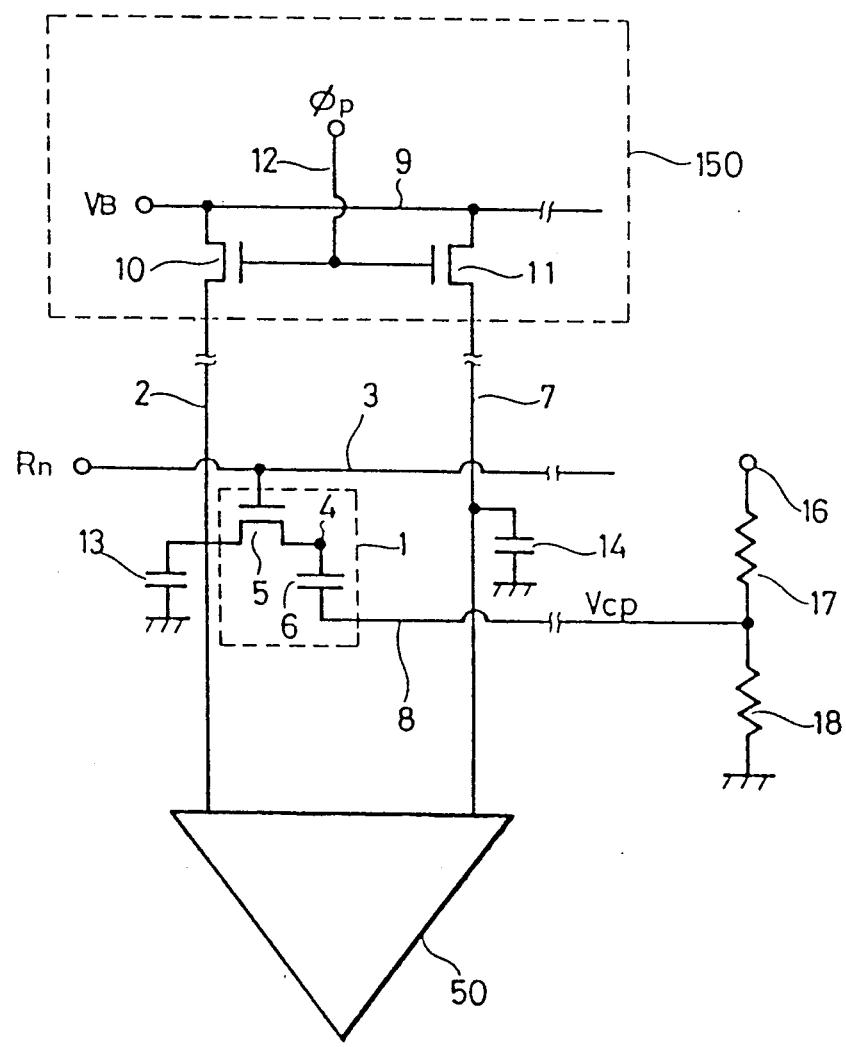
FIG. 3 is a schematic diagram showing in detail the structure of one of the bit line pairs shown in FIG. 2.
Figure 4:
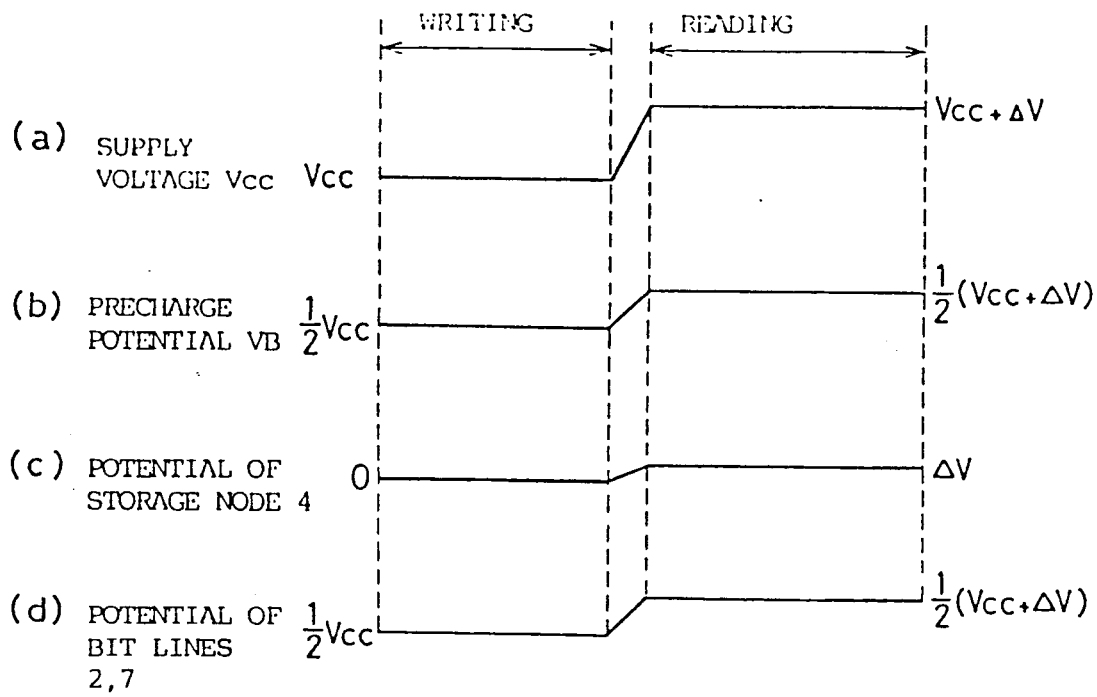
FIGS. 4 and 5 are waveform diagrams of conventional nodes related to the V bump test.
Figure 5:
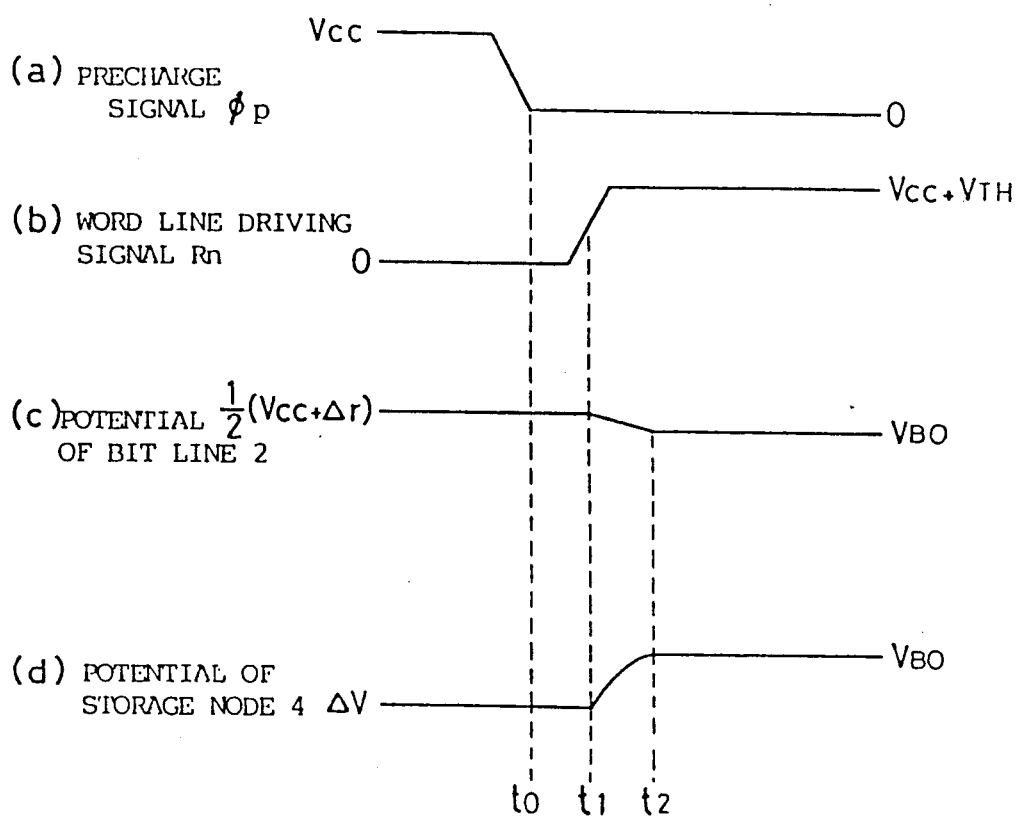

FIG. 7 is a schematic block diagram of one embodiment of the present invention. Referring to FIG. 7, an arbitrary external input signal of the DRAM, for example a $\overline{CAS}$ signal is applied to an input terminal 101. The $\overline{CAS}$ signal is applied to the control signal generating system CG shown in the above FIG. 1 as well as to a voltage detecting circuit 100. In the normal operation, the $\overline{CAS}$ signal is applied to the input terminal 101. When the V bump test mode should be set, a voltage, e.g. of 10 V, higher than the normally used operation range of, for example 5 V, is applied thereto. The voltage detecting circuit 100 detects that the voltage applied to the input terminal 101 is higher than the normal operating range. A latch circuit 110 latches the detection signal in response to the detection of the voltage higher than the normal operation range by the voltage detecting circuit 100. The latch output is applied to voltage setting circuit 120. The voltage setting circuit 120 outputs a voltage for checking operation margin of the memory cell 1 for the data "1" in response to the latch output from the latch circuit 110, and applies the voltage to the memory cell plate of the memory cell 1.

Meanwhile, a $\overline{WE}$ signal is inputted to an input terminal 201 in the normal operation, and the $\overline{WE}$ signal is applied to the control signal generating system CG. When the operation margin of the memory cell 1 for the data "0" is to be scanned in the V bump test mode, a voltage higher than the normal operation range, for example a voltage of 10 V is applied to the input terminal 201. A voltage detecting circuit 200 detects that the voltage applied to the input terminal 201 is higher than the normal operation range. The detection output is applied to a latch circuit 210 to be latched. The output of the latch circuit 210 is applied to the voltage setting circuit 120. The voltage setting circuit 120 outputs a voltage to be applied to the memory cell plate of the memory cell 1 for checking the operation margin of the memory cell 1 for the data "0" in response to the latch output of the latch circuit 210.

The operation of one embodiment of the present invention will be described in the following. When a normally used $\overline{CAS}$ signal is applied to the input terminal 101, the voltage detecting circuit 100 does not detect any voltage higher than the normal operating range, and therefore no detection signal is latched in the latch circuit 110. The voltage setting circuit 120 applies a voltage of $\frac{1}{2} \cdot Vcc$ as the cell plate voltage of the memory cell 1.

When a voltage of 10 V is applied to the input terminal 101, for example, the voltage detecting circuit 100 detects the voltage and the detection output is latched in the latch circuit 110. The voltage setting circuit 120 sets the cell plate voltage of the memory cell 1 approximately at the ground level in response to the latch output from the latch circuit 110. By doing so, the test of operation margin of the memory cell 1 for the data "1" can be carried out by the V bump test.

When a voltage of for example, 10 V, is applied to the input terminal 201 instead of the $\overline{WE}$ signal which is usually used, the voltage detecting circuit 200 detects the voltage and the detection output is latched by the latch circuit 210. The voltage setting circuit 120 sets the cell plate voltage of the memory cell 1 at the supply voltage Vcc in response to the latch output of the latch circuit 210. Consequently, in accordance with the second term ($\frac{1}{2} \cdot \Delta V \cdot V_6$) in the [ ] of the equation 16, the change becomes larger than $\frac{1}{2} \cdot Vcc$, thereby producing the effect of V bump test.

Figure 8:
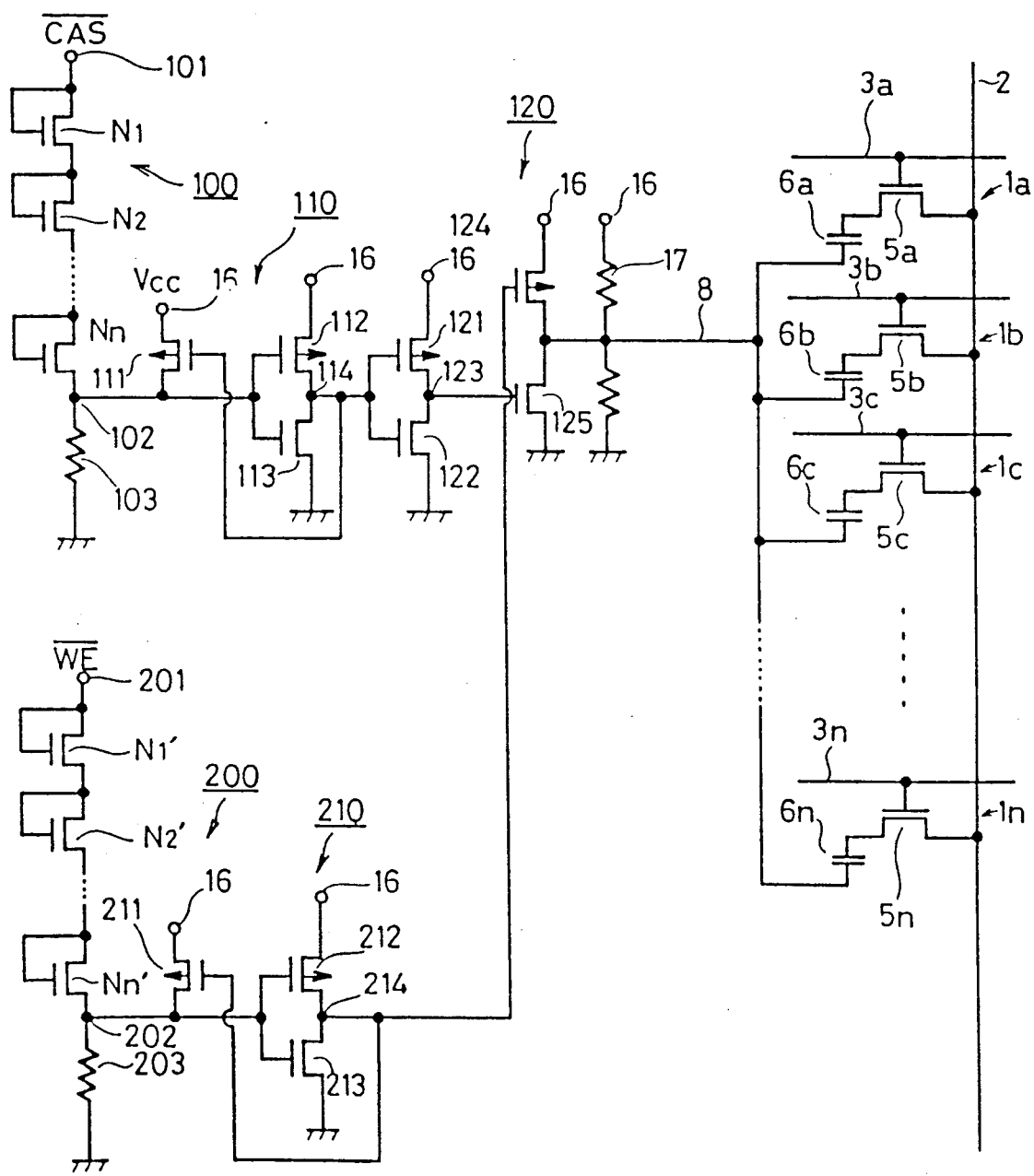
FIG. 8 is a schematic diagram showing a definite structure of one embodiment of the present invention.

FIG. 8 is a definite circuit diagram of one embodiment of the present invention.

Referring to FIG. 8, a definite structure of one embodiment of the present invention will be described. The voltage detecting circuit 100 comprises a plurality of N channel MOS transistors N1, N2 ... Nn connected in series to the input terminal 101, respective transistors having their drains connected to the gate electrodes. The source of the N channel MOS transistor Nn in the last stage is grounded by a resistance 103 having a relatively high resistance value. A latch circuit 110 is connected to a node 102 of the N channel MOS transistor Nn and the resistance element 103.

The latch circuit 110 comprises P channel MOS transistors 111, 112 and a N channel MOS transistor 113. The source of the P channel MOS transistor 111, the gate electrode of the P channel MOS transistor 112 and the gate electrode of the N channel MOS transistor 113 are connected to the node 102 of the N channel MOS transistor Nn and the resistance element 103 included in the voltage detecting circuit 100. The P channel MOS transistor 112 and the N channel MOS transistor 113 are connected in series between a power supply terminal 16 and the ground to form an inverter circuit, and this inverter circuit and the P channel MOS transistor 111 constitute a latch circuit 110. The above mentioned P channel MOS transistor 111 has its drain connected to the power supply terminal 16 and its gate electrode connected to a node 114, which is an output point of the inverter circuit constituted by the P channel MOS transistor 112 and the N channel MOS transistor 113.

The gate electrode of the P channel MOS transistor 121 and the gate electrode of the N channel MOS transistor 122 are also connected to the node 114. The P channel MOS transistor 121 and the N channel MOS transistor 122 are connected in series between the power supply terminal 16 and the ground, constituting an inverter circuit. The gate electrode of the N channel MOS transistor 125 is connected to a node 123 which is an output point of the inverter circuit. The N channel MOS transistor 125 has its drain connected to a cell plate voltage supply line 8 and its source grounded. The cell plate voltage supply line 8 is connected to a node of resistances 17 and 18 constituting a constant voltage circuit connected between the power supply terminal 16 and the ground.

Meanwhile, the second voltage detecting circuit 200 is structured in the similar manner as the above described first voltage detecting circuit 100, and it comprises a plurality of N channel MOS transistors N1', N2', ... Nn' connected in series, with the source of the N channel MOS transistor Nn' in the last stage being grounded through a resistance 203. A latch circuit 210 is connected to a node 202 between the N channel MOS transistor Nn' and the resistance element 203. The latch circuit 210 is structured in the similar manner as the above described latch circuit 110, and it comprises P channel MOS transistors 211 and 212 and an N channel MOS transistor 213. The P channel MOS transistor 212 and N channel MOS transistor 213 are connected between the power supply terminal 16 and the ground, constituting an inverter circuit. The inverter circuit constitutes, together with the P channel MOS transistor 211, a latch circuit. A node 214 which is an output end of the inverter circuit is connected to the gate electrode of the P channel MOS transistor 124. The P channel MOS transistor 124 has its drain connected to the power supply terminal 16 and its source connected to a voltage supply line 8.

The voltage supply line 8 is connected to a cell plate which is one electrode of each of the capacitances 6a, 6b, 6c ... 6n included in the memory cells 1a, 1b, 1c ... 1n, respectively. The capacitances 6a, 6b, 6c, ... 6n are respectively connected to the transfer gates 5a, 5b, 5c ... 5n. The transfer gates 5a, 5b, 5c ... 5n have their gate electrodes connected to the word lines 3a, 3b, 3c ... 3n, respectively and their drains connected to a bit line 2.

FIG. 9 is a timing diagram illustrating the operation of the embodiment shown in FIG. 8.

The operation of one embodiment of the present invention will be described, in the following with reference to FIGS. 8 and 9. Now, assuming that the threshold voltage ($V_{TH}$) of the MOS transistor is 0.5 V and N=13, a voltage higher than $0.5\ V \times 13 = 6.3$ must be applied between the input terminal 101 and the node 102 to render these N channel MOS transistors N1, N2 ... Nn conductive. The maximum value of the input signal of the DRAM on the "H" level side is defined as 6.5 V. In the normal operation, the node 102 is grounded by the resistance element 103 to be at the "L" level.

Consequently, the P channel MOS transistor 112 becomes conductive, the node 114 becomes "H" level, the N channel MOS transistor 122 becomes conductive and the node 123 becomes "L" level. The N channel MOS transistor 125 becomes non-conductive and the memory cell plate voltage becomes ½·Vcc as shown in FIG. 9(c), and therefore no strong electric field is applied on the insulating film of the memory cell capacitance.

When the voltage at the input terminal 101 is set higher than 6.5 V, for example at 10 V as shown in FIG. 9(b), a voltage of about $10\ V - 6.5\ V = 3.5\ V$ is generated at the node 102. Consequently, the N channel MOS transistor 113 becomes conductive and the level of the node 114 becomes "L" level. Therefore, the P channel MOS transistor 111 becomes conductive, the node 102 is raised to the level of the supply voltage Vcc, the P channel MOS transistor 112 becomes non-conductive and the N channel MOS transistor 113 becomes conductive. As a result, the latch circuit 110 latches the detection output of the voltage detecting circuit.

In response to the latch output of the latch circuit 110, the node 114 fully becomes "L" level, the P channel MOS transistor 121 becomes conductive, N channel MOS transistor 122 becomes non-conductive and the node 123 becomes the level of the supply voltage Vcc. In addition, the N channel MOS transistor 125 becomes conductive, and since the resistance 17 is set at a relatively high value for reducing power consumption and since the conductive resistance of the N channel MOS transistor 125 is set at a small value, the cell plate voltage becomes approximately the ground level as shown in FIG. 9(c).

Namely, the operation margin of the memory cells 1a, 1b, 1c ... 1n for the data "1" can be tested by the V bump test. If a terminal is provided for the V bump test, it is unnecessary to apply the voltage of 10 V to the input terminal 101. However, in a DRAM requiring dense packing, the number of terminals should be as small as possible. Therefore, the DRAM has no test terminal in general. In accordance with the embodiment of the present invention, the V bump test becomes possible without a test terminal.

After the V bump test mode is set in the above described manner, 10 V voltage applied to the input terminal 101 is released and a common $\overline{CAS}$ signal is applied to the input terminal 101. The $\overline{CAS}$ signal is applied in pulses and the voltage thereof sometimes becomes 0 V. However, even in this case, the level of the node 102 is maintained at the level of the supply voltage Vcc by the latch circuit 110, and therefore a required V bump test is possible.

In order to quit the V bump test state, the supply voltage Vcc should be once lowered to 0 V as shown in FIG. 9(a). By doing so, the level of the node 102 becomes the ground level, enabling the normal operation.

When a $\overline{WE}$ signal having the voltage higher than the normal operating range is externally applied to the input terminal 201 of the voltage detecting circuit 200 as shown in FIG. 9(d), N channel MOS transistors N1', N2' ... Nn' become conductive and the node 202 becomes "H" level. The "H" level signal is inverted by the P channel MOS transistor 212 and the N channel MOS transistor 213, and the node 214 becomes "L" level. Consequently, the P channel MOS transistor 124 becomes conductive and the cell plate voltage is set at the supply voltage Vcc as shown in FIG. 9(e).

Although the cell plate voltage is the supply voltage Vcc in this embodiment, the value is not limited to Vcc, and any value may be used to provide the effect of the V bump test provided that the change is larger than ½·Vcc in accordance with the second term (½·ΔV·C₆) in the [ ] of the above described equation (16).

When the setting of the V bump test mode is completed, the voltage of 10 V which has been applied to the input terminal 201 is released and a common $\overline{WE}$ signal is applied to the input terminal 201 to carry out the V bump test. When the V bump test is finished and the latch of the latch circuit 210 should be released, the supply voltage Vcc must be once lowered to 0 V.

Although a voltage higher than a common operation range is applied to the input terminals 101 and 201 to which $\overline{CAS}$ signal and $\overline{WE}$ signal are applied in the above described embodiment, the voltage higher than the common operation range may be applied to the terminals to which $\overline{RAS}$ signal and the data input signal are applied.

As described above, according to the embodiment of the present invention, the voltage generated by a constant voltage generating circuit is controlled when the signal voltage is out of a predetermined operation range, so that test of memory cells having small margins can be carried out in a short period of time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a test mode setting circuit, comprising:
   a plurality of memory cells (1) each formed of an insulating gate type filed effect transistor and a capacitance;
   external input means to which a control signal is externally applied;
   constant voltage generating means connected to one electrode of said capacitance; and
   control means for controlling, when a signal voltage applied to said external input means is out of a predetermined operation range, a voltage generated by said constant voltage generating means.

2. A semiconductor memory device having a test mode setting circuit according to claim 1, wherein
   said input means includes two external input terminals and said control means comprises
   first voltage detecting means detecting that a signal voltage applied to one of said external input terminals becomes higher than a predetermined voltage,
   second voltage detecting means detecting that a signal voltage applied to the other of said external input terminals becomes higher than a predetermined voltage, and
   voltage setting means outputting a reference voltage potential from said constant voltage generating means in response to a detection output of said first voltage detecting means, and outputting a voltage at a nominal supply potential in response to a detection output from said second voltage detecting means.

3. A semiconductor memory device having a test mode setting circuit according to claim 2, wherein
   said voltage setting means comprises
   first latch means latching an output of said first voltage detecting means, and
   second latch means latching an output of said second voltage detecting means.

4. A semiconductor memory device having a test mode setting circuit according to claim 3, wherein
   said first and second latch means comprise means for releasing latch when power supply is cut off.

5. A semiconductor memory device having a test mode setting circuit according to claim 2, wherein
   said first and second voltage detecting means respectively comprise a plurality of field effect transistors connected in series.

6. In a semiconductor memory device including a plurality of memory cells each formed of an insulating gate type field effect transistor and a capacitor, a test mode setting and control circuit comprising:

first voltage detection means for generating a first output signal in response to a first control voltage exceeding a first predetermined level, and
second voltage detection means for generating a second output signal in response to a second control voltage exceeding a second predetermined level,
voltage setting means for applying a cell plate voltage to a memory cell capacitor in response to either said first output signal or said second output signal, said voltage setting means comprising:
   a) means responsive to said first output signal for applying a cell plate voltage to said memory cell capacitor having a value which is approximately twice the value of the cell plate voltage applied during normal memory operation, and
   b) means responsive to said second output signal for applying a cell plate voltage of a reference potential to said memory cell capacitor.

7. A method of testing a semiconductor memory device including a plurality of control terminals for controlling normal memory operation and a plurality of memory cells each formed of an insulating gate type field effect transistor and a capacitor, said method comprising the steps of:
   applying a test control signal to a first terminal of said control terminals for testing a first data level,
   applying a test control signal to a second terminal of said control terminals for testing a second data level,
   detecting a voltage at said first and second terminals,
   generating a first output signal in response to a detected voltage level at said first terminal exceeding a first predetermined normal operating level,
   generating a second output signal in response to a detected voltage level at said second terminal exceeding a second predetermined normal operating level,
   applying a cell plate voltage to said memory cell capacitor having a value which is approximately twice the value of the cell plate voltage applied during normal memory operation in response to said first output signal, and
   applying a cell plate voltage of a reference potential to said memory cell capacitor in response to said second output signal.

8. A semiconductor memory device having a test mode setting circuit for supply voltage fluctuation tests, comprising:
   a plurality of memory cells, each of which comprising a field effect transistor and a capacitor;
   a constant voltage generating means connected to one electrode of the capacitor for applying a bias voltage to the capacitor for reducing the electrical field in the capacitor during normal operation;
   an external input terminal for receiving control signals during normal operation; and
   control means for varying the bias voltage to the capacitor in response to application of a signal voltage outside an operating range of the control signals to the external input terminal.

* * * * *